United States Patent
Hosseini

(10) Patent No.: US 10,252,507 B2
(45) Date of Patent: Apr. 9, 2019

(54) METHOD AND APPARATUS FOR FORWARD DEPOSITION OF MATERIAL ONTO A SUBSTRATE USING BURST ULTRAFAST LASER PULSE ENERGY

(71) Applicant: ROFIN-SINAR TECHNOLOGIES INC., Plymouth, MI (US)

(72) Inventor: S. Abbas Hosseini, Orlando, FL (US)

(73) Assignee: ROFIN-SINAR TECHNOLOGIES LLC, Plymouth, MI (US)

( * ) Notice: Subject to any disclaimer, the term of this patent is extended or adjusted under 35 U.S.C. 154(b) by 321 days.

(21) Appl. No.: 14/542,647

(22) Filed: Nov. 16, 2014

(65) Prior Publication Data
US 2015/0140229 A1  May 21, 2015

Related U.S. Application Data

(60) Provisional application No. 61/906,309, filed on Nov. 19, 2013.

(51) Int. Cl.
*B32B 38/00* (2006.01)
*C23C 14/28* (2006.01)

(52) U.S. Cl.
CPC .......... *B32B 38/0008* (2013.01); *C23C 14/28* (2013.01); *B32B 2255/00* (2013.01)

(58) Field of Classification Search
CPC .. C23C 14/28; B32B 38/0008; B32B 2255/00
See application file for complete search history.

(56) References Cited

U.S. PATENT DOCUMENTS

| 5,107,510 A | 4/1992 | Seguin et al. |
| 5,567,336 A | 10/1996 | Tatah |
| 5,609,284 A | 3/1997 | Kondratenko |

(Continued)

FOREIGN PATENT DOCUMENTS

| CA | 2332154 | 9/2009 |
| CA | 2907757 | 9/2014 |

(Continued)

OTHER PUBLICATIONS

Migliore et al., Advances in Laser Singulation of Silicon, Paper #770, pp. 1-6, Coherent, Inc., Santa Clara, CA, USA; HBL Corporation, Daejeon 305-811 Korea.

(Continued)

*Primary Examiner* — Dah-Wei D. Yuan
*Assistant Examiner* — Kristen A Dagenais-Englehart
(74) *Attorney, Agent, or Firm* — Woodling, Krost and Rust

(57) ABSTRACT

A process of forward deposition of a material onto a target substrate is accomplished by passing a burst of ultrafast laser pulses of a laser beam through a carrier substrate that is transparent to a laser beam. The carrier substrate is coated with a material to be transferred on the bottom side thereof. Electrons on the back side of said transparent carrier coated with the material are excited by the first few sub-pulses of the laser beam which lifts the material from the carrier substrate and subsequent sub-pulse of the laser beam send the material into space at hypersonic speed by a shock wave that drives the material with forward momentum across a narrow gap between the carrier substrate and the target substrate, and onto the target substrate.

15 Claims, 13 Drawing Sheets

(56) References Cited

U.S. PATENT DOCUMENTS

| | | | |
|---|---|---|---|
| 6,084,897 A | 7/2000 | Wakabayashi et al. | |
| 6,407,360 B1 | 6/2002 | Choo et al. | |
| 6,552,301 B2 | 4/2003 | Herman et al. | |
| 7,033,519 B2 | 4/2006 | Taylor et al. | |
| 7,211,184 B2 | 5/2007 | Webster et | |
| 7,218,448 B1 | 5/2007 | Cathey, Jr. et al. | |
| 7,303,977 B2 | 12/2007 | Voronov et al. | |
| 7,605,344 B2 | 10/2009 | Fukumitsu | |
| 7,626,138 B2 | 12/2009 | Bovatsek et al. | |
| 8,097,830 B2 | 1/2012 | Woeste et al. | |
| 8,624,157 B2 | 1/2014 | Albelo et al. | |
| 8,835,802 B2 | 9/2014 | Baer | |
| 8,842,358 B2 | 9/2014 | Bareman et al. | |
| 8,852,698 B2 | 10/2014 | Fukumitsu | |
| 9,102,007 B2 | 8/2015 | Hosseini | |
| 9,102,011 B2 | 8/2015 | Hosseini | |
| 2002/0125232 A1 | 9/2002 | Choo et al. | |
| 2002/0195433 A1 | 12/2002 | Troitski | |
| 2003/0006221 A1 | 1/2003 | Hong et al. | |
| 2003/0072890 A1 | 4/2003 | Miyazawa | |
| 2004/0017428 A1 | 1/2004 | Cronin et al. | |
| 2004/0248503 A1 | 12/2004 | Benderly | |
| 2005/0006361 A1 | 1/2005 | Kobayashi et al. | |
| 2005/0186760 A1 | 8/2005 | Hashimura et al. | |
| 2005/0269301 A1 | 12/2005 | Burrowes et al. | |
| 2006/0099810 A1 | 5/2006 | Voronov et al. | |
| 2006/0108339 A1 | 5/2006 | Nishiwaki et al. | |
| 2006/0207976 A1 | 9/2006 | Bovatsek et al. | |
| 2007/0051706 A1 | 3/2007 | Bovatsek et al. | |
| 2007/0298529 A1 | 12/2007 | Maeda et al. | |
| 2009/0151996 A1 | 6/2009 | Mishima et al. | |
| 2009/0294422 A1 | 12/2009 | Lubatschowski et al. | |
| 2010/0025387 A1 | 2/2010 | Arai et al. | |
| 2010/0084384 A1 | 4/2010 | Bovatsek et al. | |
| 2010/0279067 A1 | 11/2010 | Sabia et al. | |
| 2010/0291749 A1* | 11/2010 | Or-Bach | G11C 17/14 438/401 |
| 2011/0259631 A1 | 10/2011 | Rumsby | |
| 2012/0234807 A1 | 9/2012 | Sercel et al. | |
| 2012/0235969 A1 | 9/2012 | Burns et al. | |
| 2013/0064993 A1* | 3/2013 | Rubenchik | H05K 3/14 427/596 |
| 2013/0126573 A1* | 5/2013 | Hosseini | B23K 26/0604 225/2 |
| 2013/0183837 A1 | 7/2013 | Arai et al. | |
| 2013/0293482 A1 | 11/2013 | Burns et al. | |
| 2014/0079570 A1 | 3/2014 | Schweitzer et al. | |
| 2014/0199519 A1 | 7/2014 | Schillinger et al. | |
| 2014/0213040 A1 | 7/2014 | Morikazu et al. | |
| 2014/0340730 A1 | 11/2014 | Bergh et al. | |
| 2015/0166393 A1 | 6/2015 | Marjanovic et al. | |
| 2015/0166394 A1 | 6/2015 | Marjanovic et al. | |
| 2015/0360991 A1 | 12/2015 | Grundmueller et al. | |
| 2015/0367442 A1 | 12/2015 | Bovatsek et al. | |
| 2016/0009586 A1 | 1/2016 | Bookbinder et al. | |
| 2016/0031745 A1 | 2/2016 | Ortner et al. | |
| 2016/0059359 A1 | 3/2016 | Krueger et al. | |
| 2016/0060156 A1 | 3/2016 | Krueger et al. | |

FOREIGN PATENT DOCUMENTS

| | | |
|---|---|---|
| CN | 102785031 | 4/2015 |
| EP | 2781296 | 9/2014 |
| EP | 2898982 A2 | 12/2014 |
| EP | 2868421 A1 | 5/2015 |
| EP | 2754524 | 11/2015 |
| JP | 2006305803 | 11/2006 |
| JP | 2009066627 A | 4/2009 |
| JP | 2010160734 | 7/2010 |
| JP | 4692717 | 3/2011 |
| JP | 5089735 | 9/2012 |
| JP | 5271092 | 5/2013 |
| WO | 2009114375 A2 | 9/2009 |
| WO | 2010111089 A2 | 9/2010 |
| WO | 2012006736 | 1/2012 |
| WO | 2012094737 A1 | 7/2012 |
| WO | 2014075995 | 5/2014 |
| WO | 2014079570 | 5/2014 |
| WO | 2014111385 | 7/2014 |
| WO | 2014111794 | 7/2014 |
| WO | 2014121261 | 8/2014 |
| WO | 2014134470 | 9/2014 |
| WO | 2014144322 | 9/2014 |
| WO | 2014147048 | 9/2014 |
| WO | 2014161535 | 10/2014 |
| WO | 2015075059 | 5/2015 |
| WO | 2015094994 | 6/2015 |
| WO | 2015095264 | 6/2015 |
| WO | 2016007843 | 1/2016 |
| WO | 2016010949 | 1/2016 |
| WO | 2016079063 | 5/2016 |
| WO | 2016079275 | 5/2016 |

OTHER PUBLICATIONS

Watanabe et al., Filamentation in Ultrafast Laser Material Processing, Book for Springer Series "Progress in Ultrafast Intense Laser Science", pp. 1-6.

Yoshino et al., Micromachining With a High Repetition Rate Femtosecond Fiber Laser, JLMN—Journal of Laser Micro/Nanoengineering, 2008, pp. 157-162, Vol. 3, No. 3.

Rezaei, Saeid, Burst-Train Generation for Femtosecond Laser Filamentation-Driven Micromachining, Thesis, Graduatuate Department of Electrical and Computer Engineering, Jan. 2011, pp. 1-118, University of Toronto.

Nguyen et al., Optical Breakdown Versus Filamentation in Fused Silica by Use of Femtosecond Infrared Laser Pulses, Optics Letter, vol. 28, No. 17, Sep. 1, 2003, pp. 1591-1593, Department of Physics, Universite Laval, Quebec, Canada.

Nicholson, David, Laser Pulse Filamentation, Submitted Coursework for PH240, Stanford University, Nov. 27, 2011, pp. 1-4.

Zlotnicki, Steve, What Is Cutting Kerf, May 19, 2013, www.esab-cutting.com, pp. 1-4.

Hosseini, S. Abbas, Method and Apparatus for Non-Ablative, Photoacoustic Compression Machining in Transparent Materials Using Filamentation by Burst Ultrafast Laser Pulses, U.S. Appl. No. 13/958,346, filed Aug. 2, 2013, Applicant: Rofin-Sinar Technologies Inc.

Hosseini, S. Abbas, Method and Apparatus for Performing Laser Filamentation Within Transparent Materials, U.S. Appl. No. 14/336,819, filed Jul. 21, 2014, Applicant: Rofin-Sinar Technologies Inc.

Hosseini, S. Abbas, System for Performing Laser Filamentation Within Transparent Materials, U.S. Appl. No. 14/336,912, filed Jul. 21, 2014, Applicant: Rofin-Sinar Technologies Inc.

Hosseini, S. Abbas, Method of Fabricating a Glass Magnetic Hard Drive Disk Platter Using Filamentation by Burst Ultrafast Laser Pulses, U.S. Appl. No. 14/512,180, filed Oct. 10, 2014, Applicant: Rofin-Sinar Technologies Inc.

Hosseini, S. Abbas, Method and Apparatus for Machining Diamonds and Gemstones Using Filamentation by Burst Ultrafast Laser Pulses, U.S. Appl. No. 14/521,114, filed Oct. 22, 2014, Applicant: Rofin-Sinar Technologies Inc.

Hosseini, S. Abbas, Method and Apparatus for Hybrid Photoacoustic Compression Machining in Transparent Materials Using Filamentation by Burst Ultrafast Laser Pulses, U.S. Appl. No. 14/520,824, filed Oct. 22, 2014, Applicant: Rofin-Sinar Technologies Inc.

Jha et al., An Integrated PCR Microfluidic Chip Incorporating Aseptic Electrochemical Cell Lysis and Capillary Electrophoresis Amperometric DNA Detection for Rapid and Quantitative Genetic Analysis, The Royal Society of Chemistry, Lab on a Chip, 2012, 12, 4455-4464.

Applied Biosystems Chemistry Guide, DNA Sequencing by Capillary Electrophoresis, Second Edition, 2009, pp. 1-250.

PE Applied Biosystems, Automated DNA Sequencing, Chemistry Guide, 1998, pp. 1-245.

Hosseini, S. Abbas, Mass Based Filtration Devices and Method of Fabrication Using Bursts of Ultrafast Laser Pulses, U.S. Appl. No. 14/531,761, filed Nov. 3, 2014, Applicant: Rofin-Sinar Technologies Inc.

(56) References Cited

OTHER PUBLICATIONS

Muller et al, Short-Pulse Lasers Enable Transparent Materials Processing, Industrial Photonics, Oct. 2014, pp. 8-10.
Hosseini, S. Abbas, Method of Closed Form Release for Brittle Materials Using Burst Ultrafast Laser Pulses, U.S. Appl. No. 14/538,648, filed Nov. 11, 2014, Applicant: Rofin-Sinar Technolgies Inc.
Hosseini, S. Abbas, Electro/Mechanical Microchips and Method of Making With Burst Ultrafast Laser Pulses, U.S. Appl. No. 14/539,861, filed Oct. 12, 2014, Applicant: Rofin-Sinar Technolgies Inc.
Strigin et al., Laser Processing of Glass by Picosecond Pulses, Quantum Electronics, 1994, pp. 732-735, vol. 24, No. 8, Kvantovaya Elektronika and Turpion Ltd.
Bhuyan et al., High Aspect Ratio Taper-Free Microchannel Fabrication Using Femtosecond Bessel Beams, Optics Express, Jan. 18, 2010, pp. 566-574, vol. 18, No. 2.
European Patent Office, Extended European Search Report, dated Mar. 18, 2015, pp. 1-6, Application No. 14179302.4, Applicant: Rofin-Sinar Technologies, Inc.
Chin et al., The Propagation of Powerful Femtosecond Laser Pulses in Optical Media: Physics, Applications, and New Challenges, Einstein Centennial Review Article, Can. J. Phys. vol. 83, 2005, pp. 863-905.
Hosseini et al., Measurement of a Filament Length Generated by an Intense Femtosecond Laser Pulse Using Electromagnetic Radiation Detection, Applied Physics B, 2003, pp. 583-586, vol. 76, Quebec, Canada.
Hosseini et al., Multi-Parameter Characterization of the Longitudinal Plasma Profile of a Filament: A Comparative Study, Applied Physics B, 2004, pp. 519-523, vol. 79.
Hosseini et al., Competition of Multiple Filaments During the Propagation of Intense Femtosecond Laser Pulses, The Americal Physical Society, Physical Review A 70, 033802, 2004, pp. 1-12.
Arnold et al., Laser Direct-Write Techniques for Priting of Complex Materials, MRS Bulletin, Jan. 2007, vol. 32 pp. 23-31.
Nagel et al., Laser-Induced Forward Transfer for the Fabrication of Devices, Nanomaterials: Processing and Characterization With Lasers, First Edition, 2012, Published by Wiley-VCH Verlag GMBH & Co. KGAA, pp. 255-316.
Palla-Papavlu et al., Laser Induced Forward Transfer for Materials Patterning, Romanian Reports in Physics, Aug. 2011, vol. 63, Supplement, pp. 1285-1301.
Pique et al., Digital Microfabrication by Laser Decal Transfer, JLMN—Journal of Laser Micro/Nanoengineering, 2008, vol. 3, No. 3, pp. 163-169.
European Patent Office, European Search Report, dated May 18, 2015, pp. 1-6, Application No. 14193909.0, Applicant: Rofin-Sinar Technologies, Inc.
Gill, Jonathan, Creating an Exotic New Form of Light With Simple Optical Elements, Nov. 2014, pp. 1-21, Waldorf School of Garden City, Garden City, New York, Laser Teaching Center Department of Physics and Astronomy, Stony Brook University, Intel Science Talent Search.
Dowski et al, Extended Depth of Field Through Wave-Front Coding, Applied Optics, Apr. 10, 1995, vol. 34, No. 11, pp. 1859-1866.
Arnison et al., High Resolution Extended Depth of Field Microscopy Using Wavefront Coding, pp. 1-19.
Siviloglou, Georgios A., Accelerating Optical Airy Beams, Dissertation, 2010, pp. 1-166.
Hosseini, S. Abbas, Method and Apparatus for Spiral Cutting a Glass Tube Using Filamentation by Burst Ultrafast Laser Pulses, U.S. Appl. No. 14/547,729, filed Nov. 19, 2014, Applicant: Rofin-Sinar Technologies Inc.
Hosseini, S. Abbas, Method and Apparatus for Laser Processing of Silicon by Filamentation of Burst Ultrafast Laser Pulses, U.S. Appl. No. 14/556,078, filed Nov. 28, 2014, Applicant: Rofin-Sinar Technologies, Inc.
Hosseini, S. Abbas, Method and Apparatus for Material Processing Using Multiple Filamentation of Burst Ultrafast Laser Pulses, U.S. Appl. No. 14/629,327, filed Feb. 23, 2015, Applicant: Rofin-Sinar Technologies, Inc.
Hosseini, S. Abbas, Method and System for Scribing Heat Processed Transparent Materials, U.S. Appl. No. 14/700,228, filed Apr. 30, 2015, Applicant: Rofin-Sinar Technologies, Inc.
Hosseini, S. Abbas, Method and Apparatus for Performing Laser Curved Filamentation Within Transparent Materials, U.S. Appl. No. 14/742,187, filed Jun. 17, 2015, Applicant: Rofin-Sinar Technologies, Inc.
European Patent Office, Extended European Search Report, dated Jul. 29, 2015, pp. 1-8, Application No. 14193908.2, Applicant: Rofin-Sinar Technologies, Inc.
European Patent Office, Extended European Search Report, dated Jul. 14, 2015, pp. 1-14, Application No. 14195892.6, Applicant: Rofin-Sinar Technologies, Inc.
European Patent Office, Extended European Search Report, dated Feb. 26, 2015, pp. 1-7. Application No. 14193911.6, Applicant: Rofin-Sinar Technologies, Inc.
European Patent Office, Extended European Search Report, dated Mar. 11, 2015, pp. 1-6, Application No. 14191146.1, Applicant: Rofin-Sinar Technologies, Inc.
European Patent Office, Partial European Search Report, dated May 18, 2015, pp. 1-6, Application No. 14193909, Applicant: Rofin-Sinar Technologies, Inc.
European Patent Office, Extended European Search Report, dated Sep. 14, 2015, pp. 1-7, Application No. 14179403.2, Applicant: Rofin-Sinar Technologies, Inc.

\* cited by examiner

METHOD AND APPARATUS FOR FORWARD DEPOSITION OF MATERIAL ONTO A SUBSTRATE USING BURST ULTRAFAST LASER PULSE ENERGY

This patent application claims priority to and the benefit of U.S. provisional patent application Ser. No. 61,906,309 filed Nov. 19, 2013. U.S. provisional patent application Ser. No. 6,190,6309 filed Nov. 19, 2013 is incorporated herein in its entirety by reference hereto.

BACKGROUND OF THE INVENTION

The principal current method of such forward deposition has utilized chemical methods involving laser drilling, coating and imaging, plating, resist coatings, etching, masking, ion activation, deposition and plating steps. The entire existing technology requires an involved, time-consuming process. The largest drawback of the current methods is the minimum achievable spacing tolerances between adjacent components pathways (traces).

A faster, more precise method of forward deposition of a desired material from a substantially transparent target material onto a substrate that allows for closer placement of adjacent elements or traces onto the substrate, would allow for a higher degree of miniaturization of electrical components and a lower component failure rate. This new invention provides a unique and novel configuration to overcome the aforementioned problems. Faster forward deposition that is cheaper than conventional methods such as CVD (chemical vapor deposition) is provided. The invention provides an environmentally friendly alternative.

SUMMARY OF THE INVENTION

The present invention relates to a method and apparatus for depositing a desired material onto a target substrate. The material to be deposited is coated/affixed/plated on a transparent material and it is known as the "ink". The material to be transferred to the target substrate is proximately located with respect to a target substrate. The material to be transferred to the target substrate resides on the transparent carrier material and is either in contact with the target substrate or is within a small distance therefrom. Specifically, the material to be deposited is within 2 mm from the target substrate. In other words there is a gap of less than or equal to 2 mm between the material to be transferred and the target substrate. Line depositions with heretofore unachievable widths and without any widening footprints are achieved by this invention. This method may be used for either manufacture or repair of such items as printed circuit boards, display panels or future system on glass (SOGs.) This uses a material machining technique involving burst ultrafast laser pulses that is better suited to mass production.

The general purpose of the present invention, which will be described subsequently in greater detail, is to provide an apparatus and method for forward deposition of a desired material plated onto a transparent carrier, onto a target substrate. In more general terms, the present invention relates to laser processing and modification of a coated substrate using the user-selected characteristics of self-focused, burst ultrafast laser pulses.

The propagation of ultrafast laser pulses in transparent optical media is complicated by the strong reshaping of the spatial and temporal profile of the laser pulse through a combined action of linear and nonlinear effects such as group-velocity dispersion (GVD), linear diffraction, self-phase modulation (SPM), self-focusing, multiphoton/tunnel ionization (MPI/TI) of electrons from the valence band to the conduction band, plasma defocusing, and self-steepening. See S L Chin et al. Canadian Journal of Physics, 83, 863-905 (2005). These effects play out to varying degrees that depend on the laser parameters, material nonlinear properties, and the focusing condition into the material. Due to the dependence of nonlinear refractive index to intensity, during the propagation of intense laser pulses, the central part of the pulse moves slower than the surrounding parts of the pulse due to variable refractive index that causes the pulse to self-focus. In the self focusing region due to MPI/TI plasma generated, plasma acts as negative lens and defocuses the pulse but due to high intensity self-focusing occurs again. The balancing act between focusing and defocusing creates a long plasma channel that is known as filament. Using a low per pulse energy filament leaves traces of refractive index modification in the material. The filament is surrounded by background energy that pumps energy to form the filament. This background energy is known as filament reservoir in art. Blocking or disturbing portion of reservoir will have the effect of losing filament.

The following specification describes a novel and unique method of depositing a desired material such as elemental materials: copper, chrome and also compound materials: SiC, GaN, or doped oxide glasses, from its transparent carrier (a transparent material such as borosilicate glass, Si wafers, Sapphire and even polymers, or the like) onto a target substrate intended to contain the circuit of interest—the deposited materials being the conductive pathways (whatever the electromagnetic properties of the signal to conducted might be).

Another purpose of the present invention is to provide a reduction in physical size of the planar laminate substrate used to fabricate organic laminate substrate PCBs (printed circuit boards), semiconductor components, display panels, systems on glass ("SOGs") and the like. This method will allow for greater flexibility in multiple configuration design and fabrication by shrinking the physical size of the conductive pathways to values even less than 1 µm. Since the material to be deposited can be anything sensitive to the trains of laser pulses, or envelopes of laser bursts, and, the terminus of the laser filament, the materials to be deposited can be "circuit" conductive material for electrical, magnetic or optical conduction, the only limitation being imposed by the ability of the material to be coated onto a suitable transparent substrates and the sensitivity of the material to hyper-sonic transfer using a filament.

One object of the invention is to use nonlinear effects to focus the beam below the diffraction limit.

Another object of the invention is to use an ordinary lens that has 200 µm focus spot above the carrier substrate, the beam is focused to create a filament tip 1 micron below the carrier substrate, then the filament tip is used to ablate metal from the carrier towards the target.

Another object of the invention is to use a laser beam having a short wavelength because as wavelengths decreases the filament tip size decreases and line deposition of narrower widths are possible.

Another object of the invention is to use a laser beam with a wavelength transparent to the carrier substrate.

Another object of the invention is to provide a system and method of forward deposition of materials on a substrate wherein the deposition of the materials is in very narrow lines (line widths) and the lines are spaced very close together.

Another object of the invention is to repair existing structure on substrates or to create new structure on substrates.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements. Other objects, features and aspects of the present invention are discussed in greater detail below.

DESCRIPTION OF THE INVENTION

Figure 1:
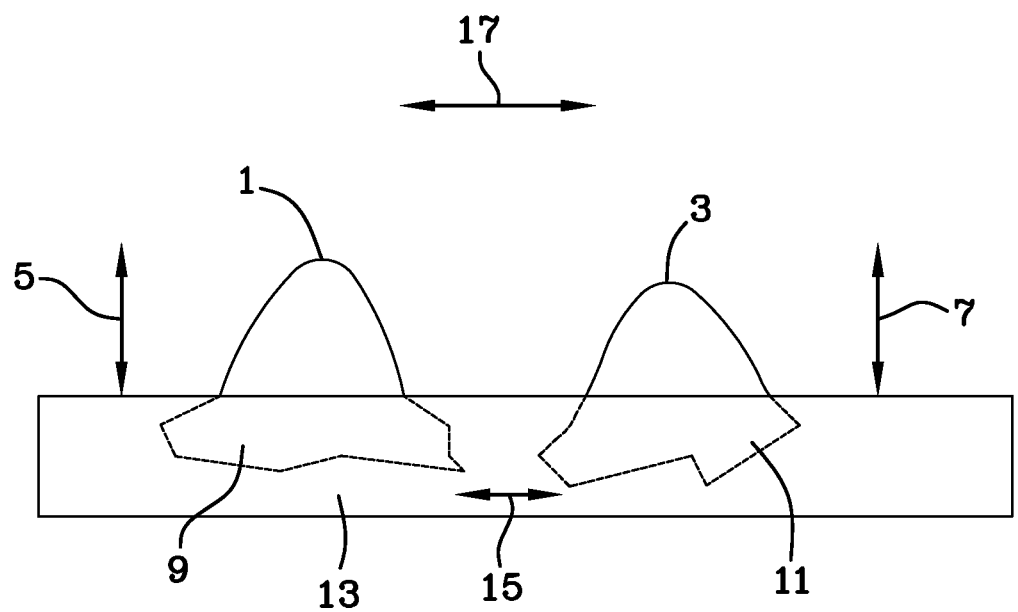
FIG. 1 is a diagrammatic representation of a prior art component substrate with two traces.

With the advent of higher processing speeds and as the reduction in electronic component geometries accelerates, manufactures of laminate substrates, including transparent substrates such as borosilicate glass for SOG, are being pushed to provide components that are capable of delivering performance values that exceed current material capabilities and production techniques while miniaturizing the component sizes. Because of rapidly emerging technologies, the boundaries between semiconductor packaging, and PCB technologies are blurred; these must all be considered concurrently in an overarching approach in order to optimize the substrate design. In the semiconductor industry, assembly and packaging is a critical competitive factor of the semiconductor product as it affects operating frequency, power, reliability, and cost.

The future substrate base for the component fabrication will need to possess better electrical characteristics such as: lower permittivity values Er (Dk); lower loss tangents (Df); highly electrically conductive metallurgy to minimize resistive voltage drops and to effectively deliver power to the chip; low-inductance connections to reduce simultaneous switching noise; low-dielectric constant insulator materials to better match board impedances and to reduce undesirable parasitic capacitances; and advanced thermal interface materials to manage high power densities on the chip and to improve the ability to work in higher temperature environments, to name a few.

Most importantly is that these future substrate bases will need to lend themselves to production techniques that allow for feature sizes in the line width (traces) and line spacing (trace spacing) much less than 10 µm. The key to resolving these problems and accomplishing a further miniaturization of electronic components lies in achieving an extremely thin, narrow and very well controlled, yet resilient conductive layer (metallic, dielectric, or hybrid) on a dielectric substrate base, that has a high peel strength and that results in much finer traces and trace spacing less than 5 um and even less than 1 um.

Although the current method addresses the deposition of various materials, such as copper, from a transparent transfer material, such as a glass, to a component substrate, such as another glass, the description herein will proceed discussing this forward deposition of material with respect to a conventional circuit board. The present technique is equally valid and advantageous for electrical, optical and magnetic circuits in combination with various suitable insulating target substrates. The technology at its heart is about extremely fine line deposition with extremely tightly controlled cross-sectional geometry achieved by using self focused burst pulse trains and the resulting filament to generate a fine-tipped "pencil" for writing extremely small features. They need not be circuits, per say, as in the case of the repair of optical masks for lithography (even EUV masks). Any material deposition process can be substantially cost engineered to create a strong incentive to switch to the techniques and structure of the instant invention, which has very broad applications, far beyond those described herein. Any material, deposited onto any other material can be replicated and then improved by application of this technique, with results that are below the diffraction limit for the optical system employed and with the attendant feature control that entails.

A conventional printed circuit board (PCB) consists of a fully resin cured fiberglass-reinforced epoxy dielectric substrate base clad on at least one side with a layer of copper. Currently, there are three mainstream industry standard methods of adhering the copper to the base: electrolysis/electrophoretic deposition; foil buildup (laminated foil on uncured laminate); and RCC (resin coated copper). Each of these methods utilize a dendritic structure for the adhesion of the copper to the substrate base.

In the first method, the substrate is prepared by roughing up the bonding surface and or applying a bonding agent that is cured onto the substrate prior to the deposition of the copper. The deposition of copper must be thick enough to achieve a dendritic adhesion to the substrate surface so as to maintain high peel strength of the copper layer. Generally this requires a copper layer that is 0.007 inch (7 mils) thick. It is this thickness that governs the limits of line width (traces) and spacing. This product can't accommodate traces and spacing less than 20 µm (0.0008 inch) wide each because it is limited by the physical characteristics of the dendritic structures required to achieve the adequate peel strength characteristic.

The second method affixes copper foil to an uncured dielectric substrate by heat and pressure in a lamination press. Again, products made by this method can't accommodate traces and spacing less than 20 µm (0.0008 inch) wide each because it is limited by the physical characteristics of the dendritic structures required to achieve the adequate peel strength characteristic as well as the etch factor effect on the copper in the related etching process steps.

The third method affixes thin copper foil to the surface of the substrate through the use of an adhesive (usually this is the same resin that the substrate laminar base is made of with the exception that it is uncured resin). Here the deep dendritic structure is formed on the copper foil before it is coated with the adhesive. It also requires a copper layer that is 0.0007 inches thick. This product can't accommodate traces and trace spacing less than 25 µm (0.00098 inch) wide because of the physical characteristics of the dendritic structures as well as the etch factor effect on the copper in the related etching process steps.

Presently as an alternative to this, forward laser deposition is used and is being developed by a number of institutions, both public and private. The ablative techniques provide very good forward momentum transfer, but cannot create fine pitch, fine CD (critical dimension, the width of the feature to be generated) control, or cross sectional fidelity. These techniques utilize standard methods of focusing the beam into or onto a carrier, like the present invention, but there the similarities stop.

In LCD manufacturing industry all TFT (thin film transistors) are manufactured using lithography techniques. There are kilometers of thin film wiring to light up each transistor of each pixel and wire disconnection is a common error in the manufacturing. The broken wires are covered with an air window cap and filled with Cr gas. A laser beam scans the area of interest and pushes the atoms to move toward the target and defuse on the target thus making the electrical connection. This method is known as CVD (chemical vapor deposition) and is a costly repair that requires highly skilled technicians to run the machine. Cr gas is toxic and not environmentally friendly and this is one of the draw backs of this technology. Since there is no replacement technology that is cheap and green, the lithography industry uses CVD for repair.

The process of forward deposition onto a substrate is accomplished by passing burst ultrafast laser pulses of light through a carrier material that is transparent to a laser beam, (such as glass), that has been coated on its bottom side with a material of interest to be transferred (such as copper in the case of PCB or Cr, in the cases of reticles or LCD) and exciting the electrons on the back of the copper (at the transparent, carrier material/copper interface) with the first few sub-pulses, which lifts the material from the carrier substrate. The next few pulses travel through the carrier substrate and do not encounter any material to lift and now pass through the carrier, with a very high divergence angle, which sends the now-lifted material into space at hyper sonic speed by the shock wave that drives the copper with forward momentum across the narrow gap between the carrier material and the adjacent target substrate, and onto the target substrate in such a fashion so as to fuse the copper onto the target substrate. This material thus deposited is also flash annealed in the process by virtue of extremely high and uniform energy density achieved on the surface of the deposited material as it is traveling toward the substrate. It provides for thermal and "ballistic annealing".

The transfer produces adjacent lines (or traces) which are close together. Put another way, the gap between adjacent lines is much smaller than the "spot size" of the incident laser beam. The spot size is the diameter of the laser beam incident on the first surface of the carrier material. The substrate and carrier generally will not be in contact with each other. Under certain circumstances, the substrate and carrier can be in contact with each other, depending upon the desired result. The substrate and carrier must be in close proximity to each other, generally no farther than 2 mm apart. If the separation is greater than 2 mm, there may be a problem encountered with some materials wherein the transfer might be incomplete or not uniform. The geometry and dimensions of the forward deposited material are controlled by the fluence, spot size, focal point and pulse energy of the laser beam. It is to be noted that the size of the forward deposited material may much smaller that the spot size but also can be much larger than the spot size in manufacturing or production situations where multiple scans and multiple passes of the laser beam may be made with various overlapping patterns to create very large zones of uniformly or non-uniformly deposited materials.

Figure 6:
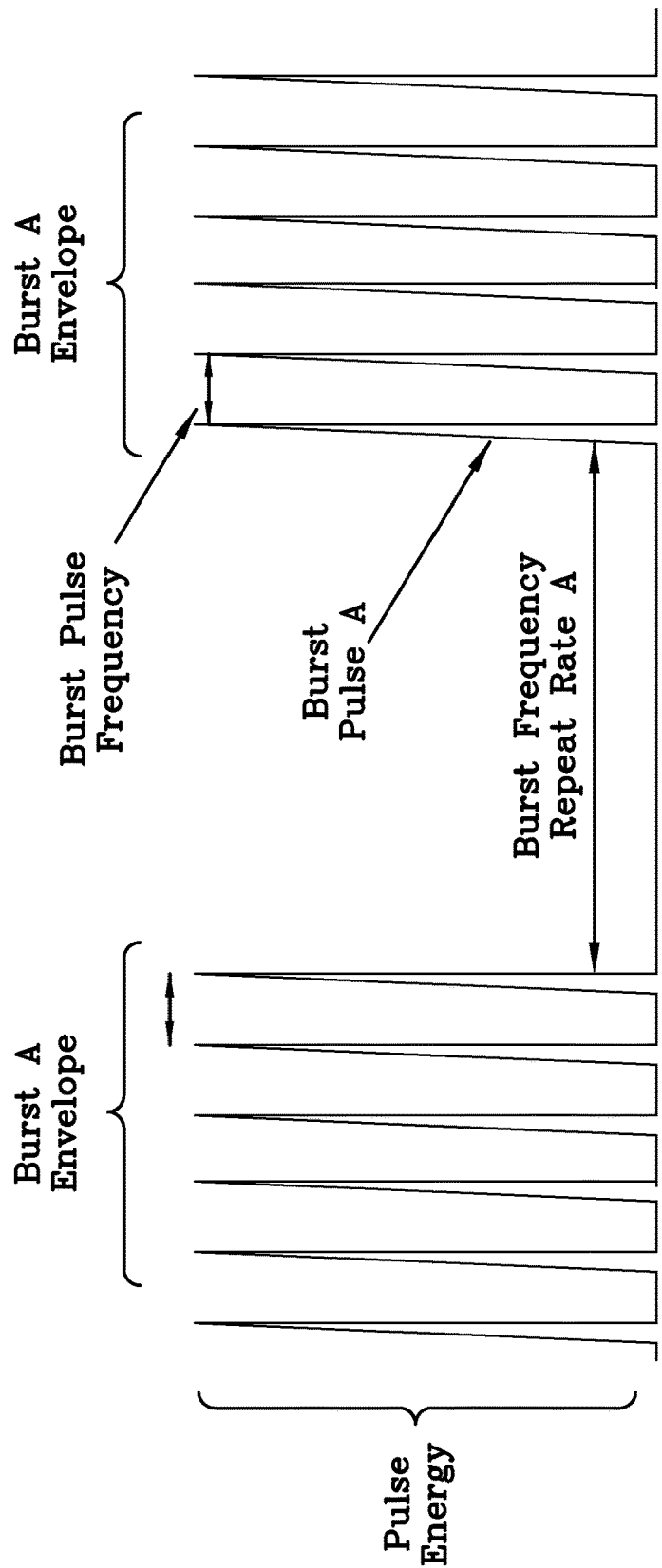
FIGS. 6-8 are representative views of the energy profiles of differing bursts of ultrafast laser pulses.
Figure 7:
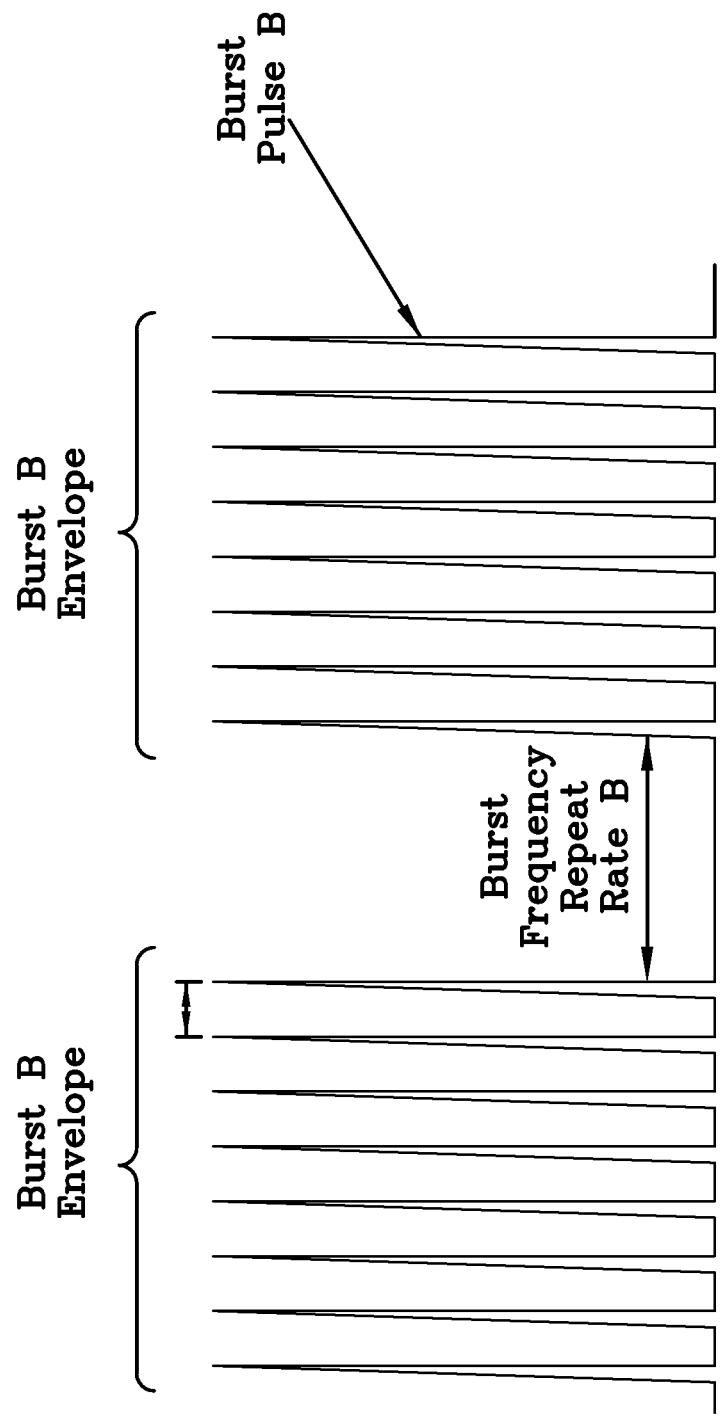
Figure 8:
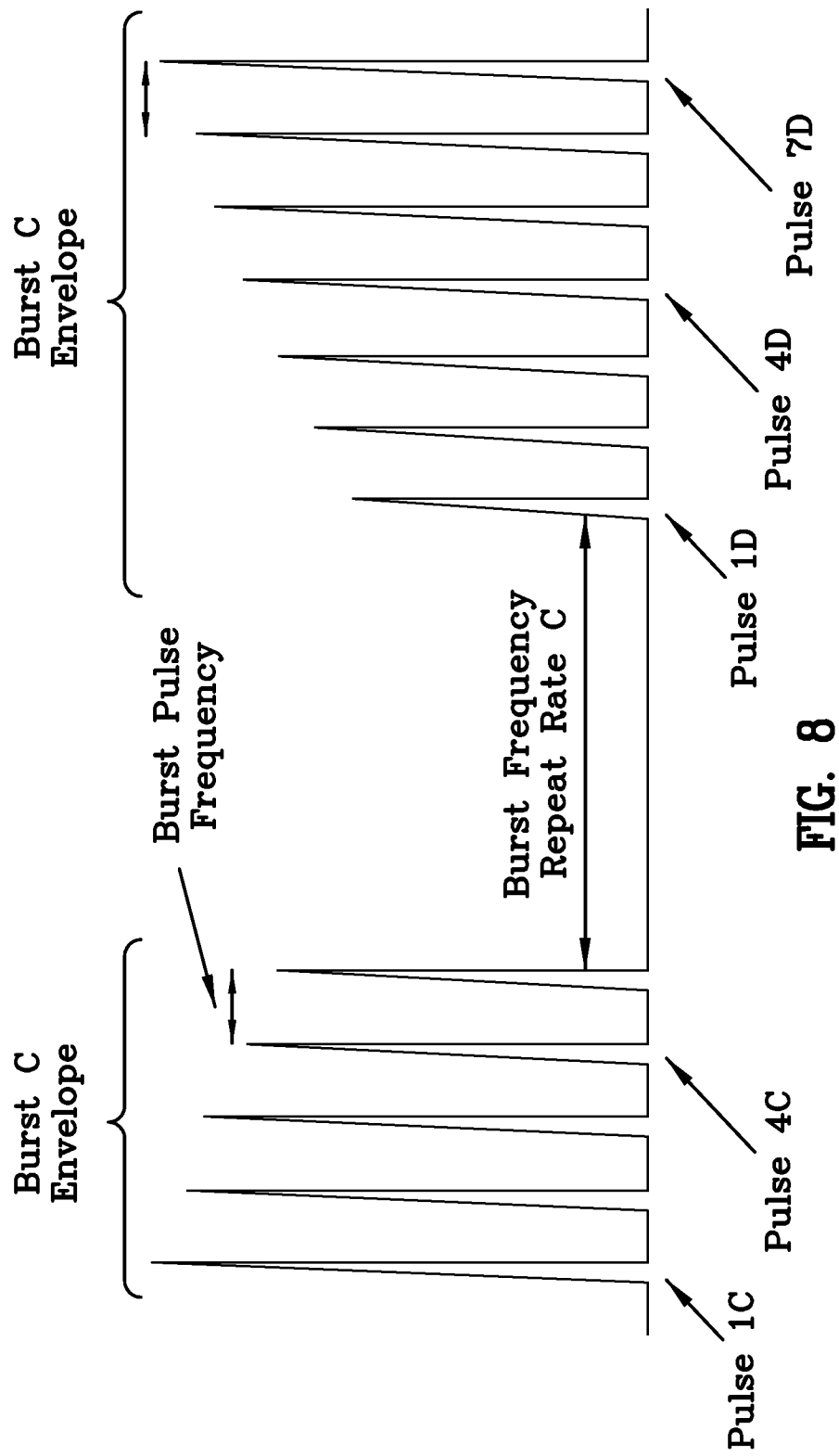

Instead of applying the filament tip for removing the material from the carrier as is taught here, one might think of using a very high NA (numerical aperture) to focus the beam tightly and achieve a very small spot size. However, the beam diverges widely after the focus and resulting deposition would be very wide. Using the filament tip helps to focus the beam below the diffraction limit while the burst effect assists in smooth material removal and annealed "cured" deposition. Another object of the invention is to use an ordinary lens that has a 200 µm focus spot above the carrier substrate, the beam is focused to create a filament tip 1 micron below the carrier substrate, then the filament tip is used to ablate metal from the carrier towards the target. See FIGS. 6, 7 and 8 which illustrate different burst patterns within burst pulse envelopes A, B, and C. FIG. 8 illustrates the pulses within the envelopes with varying pulse energies and burst pulse frequencies.

The present invention affixes the desired material to a component substrate base using the energy of burst filament created by ultrafast laser pulses through a transparent carrier target and in so doing does not require the dendritic structure for the adhesion of the desired material to the substrate base because of the flash annealing previously discussed. As such the width between traces is also minimized. As a byproduct of the burst ultrafast laser process, the deposited material is also annealed and it is possible to precisely enable small width deposition down to sub-micrometer wide traces. However, perhaps the most important characteristic of the laser enabled forward deposition process is the cross sectional geometry of the deposited material.

Figure 2:
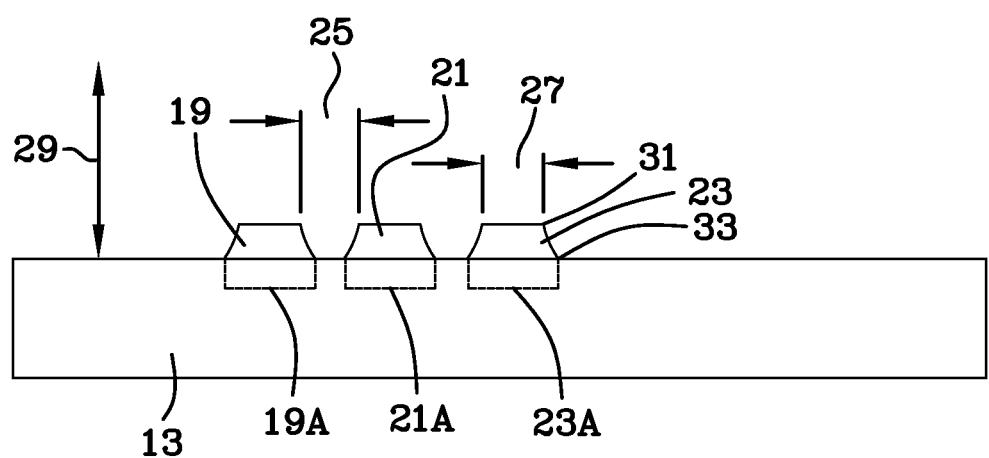
FIG. 2 is a diagrammatic representation of a component substrate with three traces fused thereon by the application burst ultrafast laser pulses.

Referring to FIG. 1 and FIG. 2 one can see the physical differences between the tracings of the prior art and those of component substrate bases created by ultrafast laser pulse energy transfer.

Referring to FIG. 1, the tracings illustrated by reference numerals 1 and 3 created by the prior art are anchored to the substrate 13 by deep irregular anchoring bottoms 9 and 11. Etchings 9 and 11 are not identical in cross sectional size or shape. Tracings 1 and 3 vary in their heights as indicated by dimension arrows 5 and 7. Anchoring bottoms 9 and 11 are not identical and extend wider than their bases on substrate 13. Since the anchoring bottoms 9 and 11 are wider than the bases, the separation between tracings 1 and 3 is dictated by the minimum separation distance as indicated by dimensional arrow 15. Thus, the actual operational distance separation between adjacent tracings is shown by dimensional arrow 17.

Referring to FIG. 2, tracings 19, 21 and 23 created by the present inventive method, it can be seen that these tracings are fused to the substrate 13 such that the operational distance separation between adjacent tracings is much smaller than in the prior art as indicated by dimensional arrow 25. Tracings 19, 21 and 23 have a narrower top 27 than is seen in the prior art tracings 1, 3. The tracings of the invention include less mass of tracing material as compared with those of the prior art, however, they are arranged more efficiently and orderly.

Referring to FIG. 2, the top edge 31 and bottom edge 33 of these traces are much sharper than those of the prior art as the applied material has been released from a constant thickness material plated onto the carrier substrate. The attachment zones and the annealing zone are somewhat exaggerated for clarity in FIG. 2, but in practice are much smaller than indicated and always smaller than the dimensions (length and width) of the material thus deposited.

A respective zone 19A, 21A, and 23A of adhesion (attachment zone) and annealing resides beneath each tracing 19, 21 and 23. The zones of adhesion and annealing result from the energy deposition of the burst ultrafast laser pulses.

As can be seen, the tracings applied to substrate 13 by the present inventive method may be narrower, closer together and dimensionally closer in cross sectional geometry than the traces achieved by the prior art. There is a very high degree of control regarding these parameters as well as the placement of the forward deposited material. These characteristics allow for a gross reduction in size of the overall component and precise component tracing on the substrate.

Figure 3:
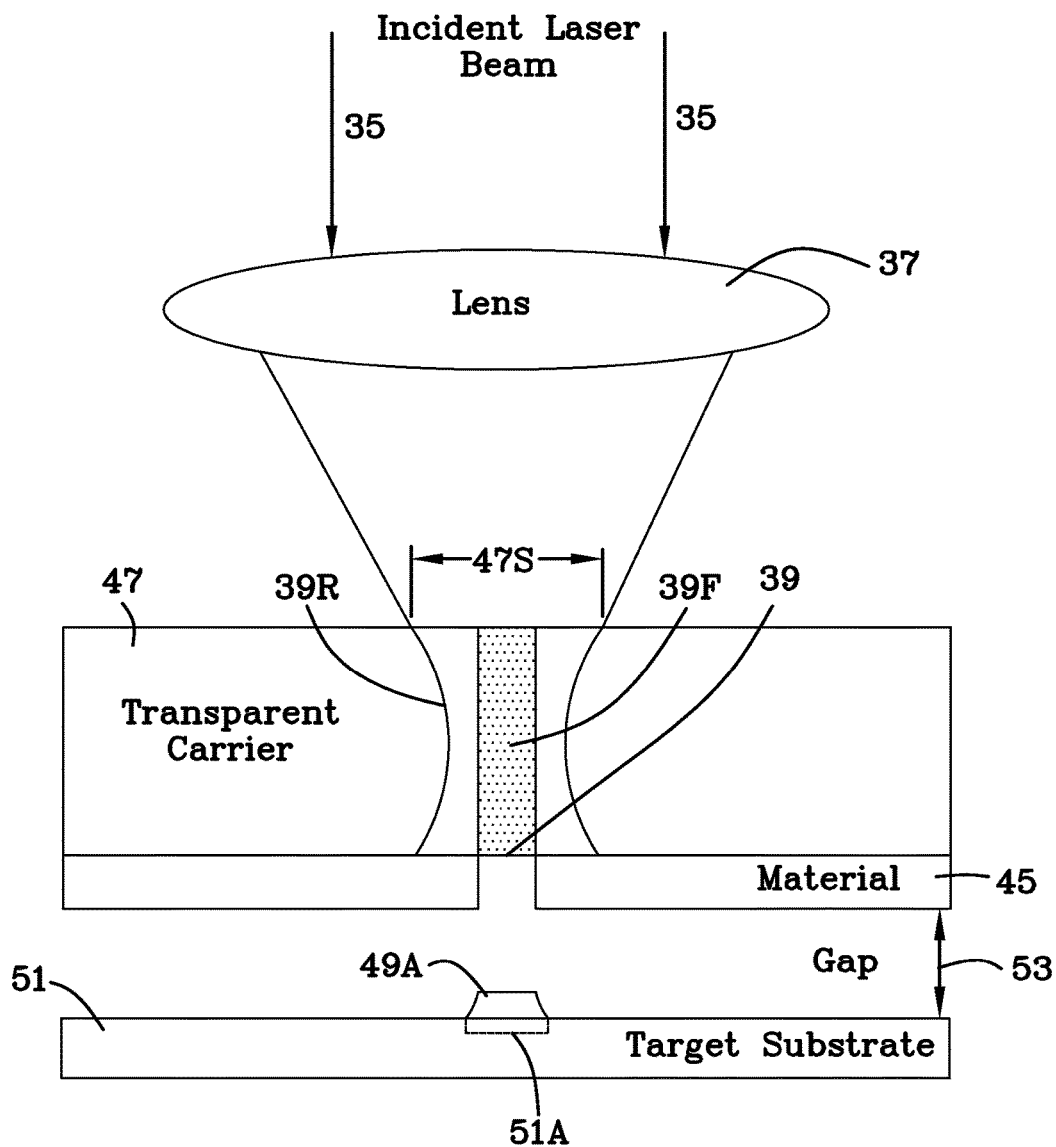
FIGS. 3-5 are a representative cross sectional views of forward deposition laser arrangements wherein the filament occurs below the top surface of the transparent substrate and with varying spot sizes.
Figure 4:
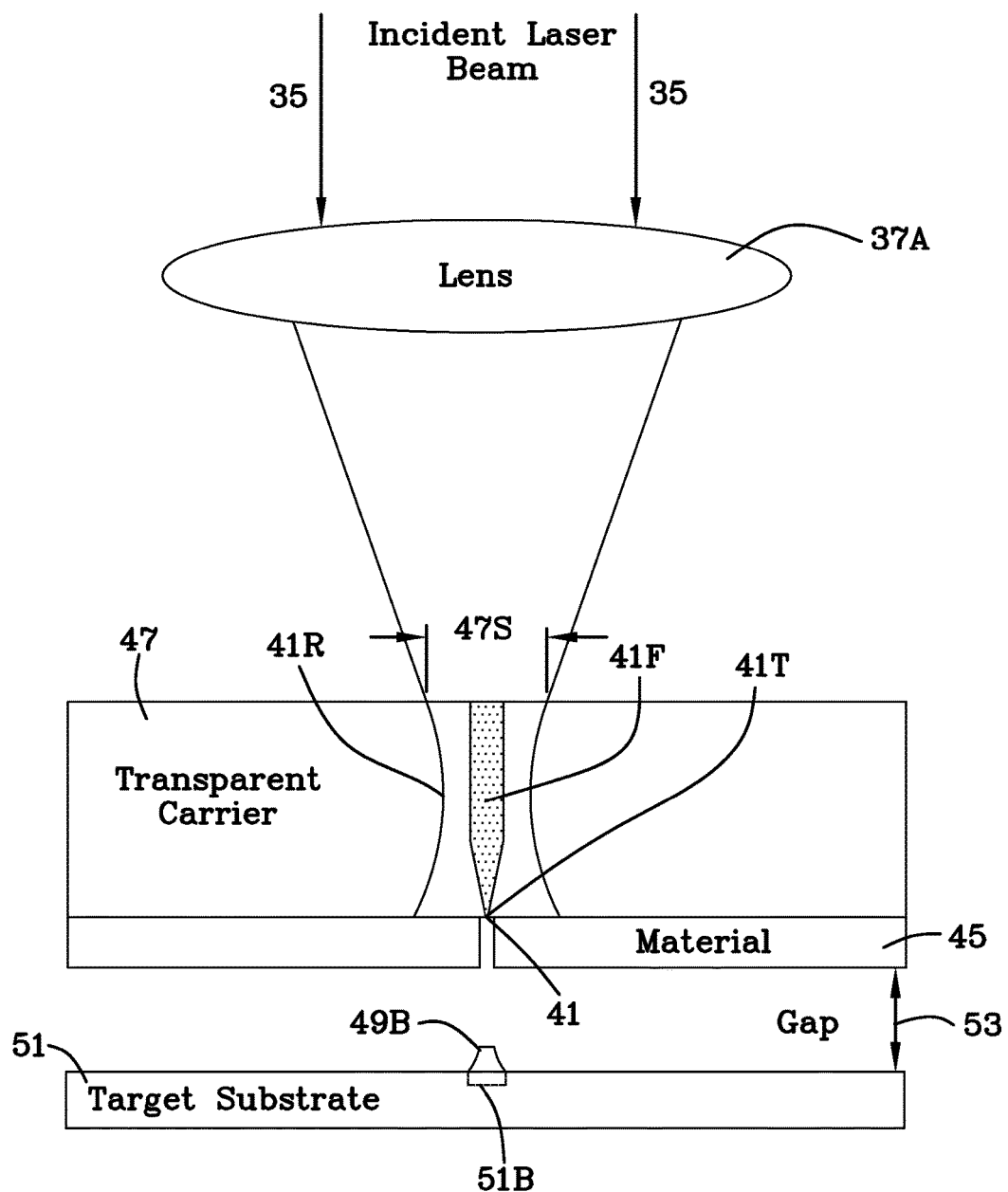
Figure 5:
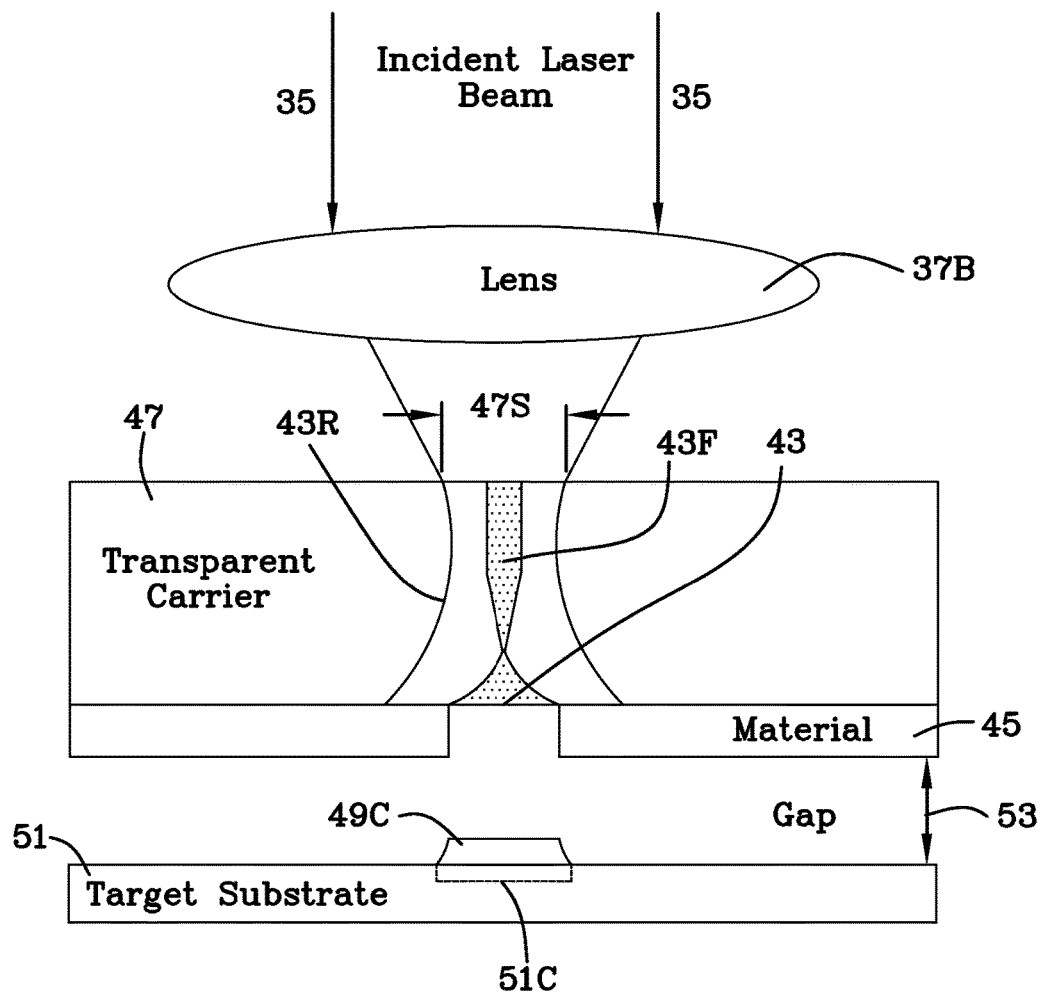

FIGS. 3-5 are a representative cross sectional views of forward deposition laser arrangements wherein the filament occurs below the top surface of the transparent substrate and with varying spot sizes. FIGS. 3-5 illustrate the condition after the material 45 has been transferred to the target substrate. FIG. 3 illustrates, diagrammatically, incident laser beam 35, lens 37, filament 39F, reservoir 39R, spot 39 at the interface between the transparent carrier and the material 45, transparent carrier 47 with material 45 attached thereto, and, a portion of the material 49A deposited on and in substrate 51 as indicated by attachment zone 51A. Filament diameters are less than or equal to 2 µm. By way of example only, the diameter of spot 39 at the interface between the transparent carrier and the material is in the range of 4-6 µm. The diameter of the spot size 47S on the top of the transparent carrier 47 can be adjusted between 50-200 µm. Gap 53 is by way of example and it is in the range of 0.00 mm to 2 mm.

Figure 4A:
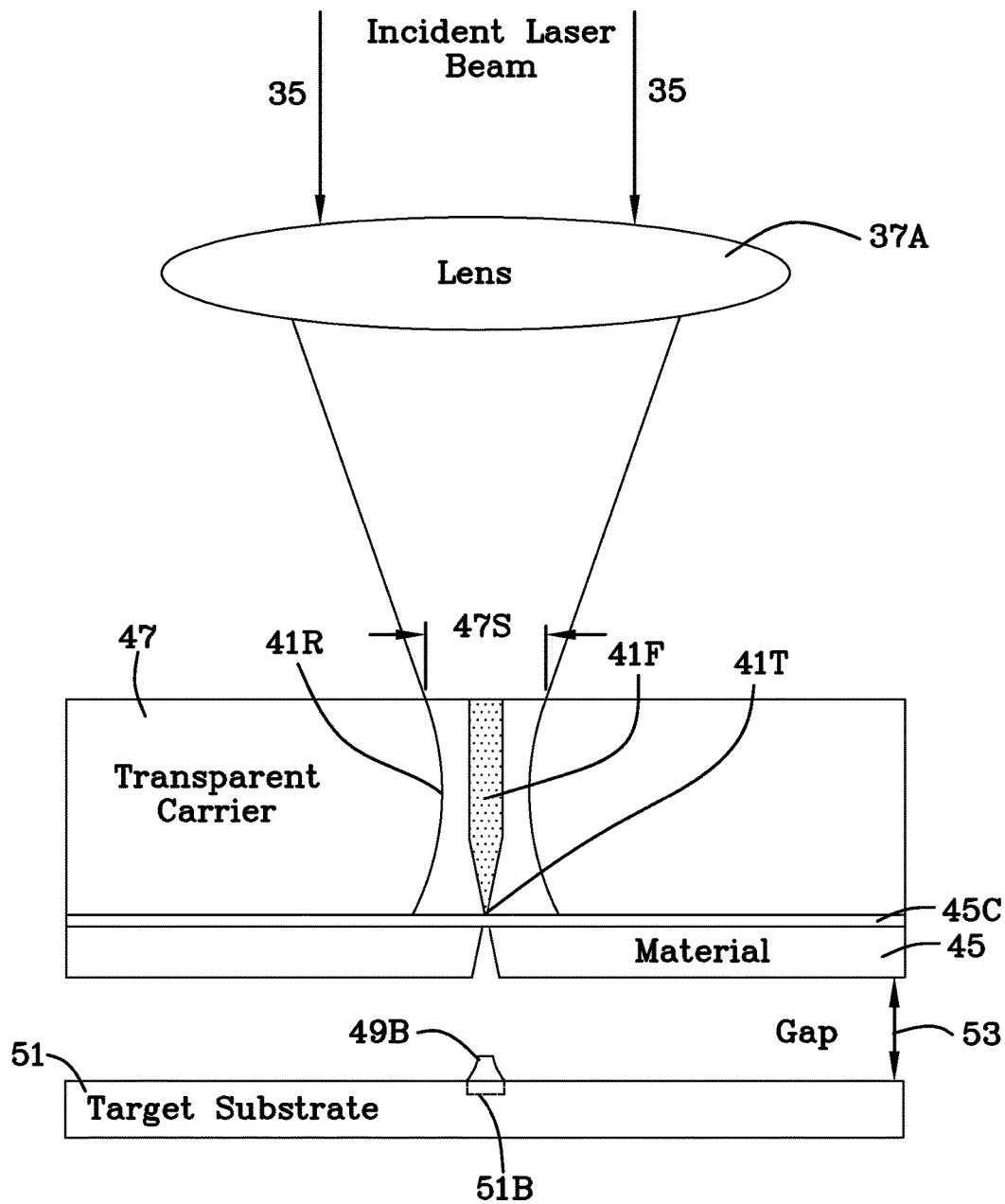
FIG. 4A is a diagrammatic illustration of a forward deposition laser.

FIG. 4 illustrates, diagrammatically, incident laser beam 35, lens 37A, filament 41F with 2 µm diameter and tip 41T, reservoir 41R, spot 41 at the interface between the transparent carrier and the material 45, transparent carrier 47 with material 45 attached thereto, and, a portion of the material 49B deposited on and in substrate 51 as indicated by attachment zone 51B. Tip 41T may be less than 500 nm in diameter. By way of example only, the diameter of spot 41 at the interface between the transparent carrier 47 and material 45 is approximately the diameter of the filament tip 41T. The diameter of the spot size 47S on the top of the transparent carrier 47 can be adjusted between 50-200 µm. The example of FIG. 4 is capable of producing very thin lines of ink (metal or some other material) applied to the target substrate 51. Gap 53 is by way of example and it is in the range of 0.00 mm to 2 mm. Still referring to FIG. 4, the tip 41T is adjusted to the interface of the transparent carrier 47 and the material 45 by moving filament 41F vertically through the adjustment of lens 37A. FIG. 4A is substantially the same as FIG. 4 but shows an additional coating 45C which facilitates release of material 45 from the carrier substrate 47. ITO may be used as the release material 45C.

FIG. 5 illustrates, diagrammatically, incident laser beam 35, lens 37B, diverging filament 43F with a 20 µm tip 43T, reservoir 43R, spot 43 at the interface between the transparent carrier and the material 45, transparent carrier 47 with material 45 attached thereto, and, a portion of the material 49C deposited on and in substrate 51 as indicated by attachment zone 51B. By way of example only, the diameter of spot 43 at the interface between the transparent carrier 47 and material 45 is 20 µm. The diameter of the spot size 47S on the top of the transparent carrier 47 can be adjusted between 50-200 µm.

Still referring to FIGS. 3-5, representative cross sectional views of forward deposition laser arrangements with varying spot sizes, and filament positions relative to the carrier substrate, it can be seen how the incident laser beam is focused through a lens so as to form filaments 39F, 41F or 42F and spots 39, 41 or 43—without regard to where the focal waist is located—of varying diameters at the interface of the transparent carrier 47 and the material to be deposited 45. The critical point here is the location of the filament defines the ultimate resolution of the technique. The resultant energy also does not damage the material to be transferred but rather builds in it stepwise because of the burst pulse feature of the laser beam, until the material to be deposited is cleanly severed (lifted) from the transparent carrier and the energy causes a forward deposition to occur and the material to be deposited jumps across the air gap 53 and fuses the traces 49, 49A, 49B to the target substrate 51.

Still referring to FIGS. 3-5, it can be seen that a substantially planar transparent carrier material (glass, sapphire, Si, SiC, etc) is coated on one of its planar faces with a material of interest 45, so as to become a carrier 47. The methods of thin film deposition of a metal onto a transparent material such as borosilicate glass, are well known. Optionally, a release coating 45C such as ITO may be used as illustrated in FIG. 4A. The material of interest 45 (commonly a conducive metal such as Chromium, or other metals, as well as non-metals and metalloids, organic materials, and polymers) is to be precisely deposited in specific traces upon a target substrate 51, possible for additive repair to an existing substrate with a damaged circuit or trace (in the case of a photomask for lithography for instance or an LCD circuit, which now utilizes an expensive and slow method or additive repair in special environs). An incident beam of intense burst ultrafast laser pulses 35, with specific adjustments of the laser parameters as discussed above, is focused through a lens 37 to create a variable (and user selectable) sized focal spot onto the desired location at the transparent carrier/material to be deposited interface 39, 41, 43, that creates a buildup of sufficient energy into the material that is deposited gradually (or gently) rather than all at once. This gradual buildup results in the material to be deposited being liberated from its transparent carrier material and driven across the air gap 33 between the carrier material 47 and the component substrate 51 where the material to be deposited (still in an energized and possibly heated state) is fused to the face of the component target substrate 51. Depending on the energy levels of the laser beam 35 and the specific material to be deposited and its thickness, annealing "curing" may also occur. The time scales of these processes occurring on or about the spacing between successive pulses of laser light or a multiple thereof.

The advantage of this technique is the ability to create precisely width-controlled conductive lines (traces), for repairing display monitors or other high value electronic component substrates. With the prior art methods utilizing lasers, the width or trace of the deposited line is always larger than the laser spot incident on the material of interest and the substrate, and it is also not very repeatable with poor cross sectional geometry.

Burst laser pulses also properly anneal the deposited material as well as precisely enable small trace width deposition down to 50 nm. Varying the pulses and the energy profile therein can create a high degree of process control. Scanning the laser over a substrate with precise locations of required deposition loaded into a tool file, a large format device layout can be additively repaired in a manner not previously available to the industry. One green advantage is the technique (process) being carried out at atmospheric conditions, not under vacuum as with current repair techniques. One cartridge which is about 25 mm by 50 mm can be used for micro soldering repair of thousands of defects, and is very easy to change to new cartridge. See FIGS. 12 and 12B.

Describing this event in the terms of physics, the time between the sub pulses of a single burst pulse of the laser beam is smaller than the thermal relaxation time constant of the material to be deposited. Thus, the laser energy goes into the material to be deposited at the region of the focal spot in bursts faster than it can be thermally dissipated, resulting in the amount of energy in the material of interest rising from its ground state in stepwise amounts. This allows control over the input of laser fluence to the material to be deposited that reduces the collateral damage to the material and allows the material to be excited above its ground state (such that deposition transfer may occur) while controlling the temperature rise (to avoid laser ablation or surface melting) and the size of the residually heated zone (to control localized micro cracking and mechanical shock.). The pulse energy is always adjusted to avoid any damage to the carrier material and always stays beyond ablation threshold of the ink (coated material). This is to make sure that no debris from the carrier substrate will ablate and fly on the traces.

The combination of ultrafast laser pulses with high-repetition rate bursts (>10 kHz) enables a plethora of possibilities in material processing. Specifically here, the high repetition rate controls processes evolving in the material to be transferred, between each ultrafast laser pulse and subsequent ultrafast laser pulse, so as to enable the process of forward deposition.

It is known that the pulse duration, wavelength or pulse-shape of a laser beam pulse can impart new material interactions and that laser material processing in the ultra-short-pulse regime (<100 picoseconds) has advantages not available with longer pulses. Ultrashort lasers offer high peak intensity to modify materials by initiating multiphoton, tunnel ionization, and electron-avalanche processes. By adjusting the intensity, wavelength, and pulse duration of ultrafast lasers/material interactions, many laser processes may now proceed that heretofore resulted in too much collateral damage to justify the results. With regard to good heat conductor metals such as copper, the short duration of the laser pulses (high repetition rates greater than 100 kHz) ensures efficient energy coupling as the laser energy is input to the surface of the metal before the development of any significant heat dissipation effects can occur. Adjustment of the laser single pulse duration, the pulse-to-pulse separation, the number of pulses per burst and the time based profile of the bursts, will result in the specific temporal laser fluence input to the material for its thickness, to accomplish forward deposition while maintaining the laser fluence level below those critical levels which produce counterproductive effects (such as ablation or excessive temperature rise in the material and surrounding area).

As another example having a laser with average power of 5 W, 12 ps pulse duration set at 50 kHz, 1064 nm wavelength, having 8 pulses in each burst envelope with a burst frequency of 50 MHz will give 12.5 µJ/pulse. This is equivalent to about 2 MW peak power that is enough to ablate material on the carrier and within the border of critical power to make filaments in glass. The filaments won't be strong enough to damage or ablate the substrate but will perform refractive index modification in the bulk. With the laser working in burst mode, it is possible to do the whole process with a single pulse in the burst, in this case, 5 W, 12 ps pulse duration laser set at 50 kHz will generate 100 µJ/pulse which is fully enough to make a filament in glass and ablate the material on the carrier but with such a high per pulse energy there is potential for ablation of substrate and having debris on the deposition. In this configuration laser power must reduced. More pulses in the burst envelope have the advantage that the first few pulses causes the material lift off and transfer but the following sub-pulses help to cure and anneal the deposited material on the target. Using a high burst pulse frequency (50 MHz) is very useful since first the target looks stable to all 8 following pulses in the burst and indeed the pulse to pulse timing is shorter than the relaxation time of material and it helps for efficient heat accumulation and curing and there is no need to use heat or another laser to do the curing.

Pulse widths of between 10 fs to less than 1 ns, repetition rates of between 1 Hz to 2 MHz, bursts of pulses having between 1 to 50 pulses in the burst pulse envelope, and laser powers from 1 to 200 W can be used for the forward deposition process. Laser wavelength ranging from 350 nm to 2 um can be used. Shorter wavelengths have the benefits of having much narrower deposition width.

The actual mechanics of the forward deposition are as follows. Upon the application of an appropriately sized burst of ultrafast laser pulses to a focal spot at the interface between the transparent carrier substrate (the bottom face of the carrier media sheet) and the thin coating of material to be transferred, a thermal cloud of free electrons will be created at that "back side" on the material to be transferred that will cause the material to cleanly "pop off" (cleanly and with sharp lines demarking the spot of fluence) from the carrier substrate surface and deposit itself by fusion to the component substrate provided it is located less than 2 mm away.

This forward deposition will occur quickly within only a few laser pulses, then the laser beam is free to be positioned at another location or to follow along a more complex, continual trace pattern. There is no need to refocus the laser beam or adjust any of the beam's energy parameters provided the thickness of the material to be deposited and the gap between the carrier substrate and the component substrate remain unchanged.

The Laser Delivery ("Machining") System

It is well known in the art that there are several types of laser delivery systems currently available. All the laser delivery systems have at least two things in common; they change the location of the incident laser beam on the work piece and they allow for the adjustment of the various laser focusing, power and delivery parameters. The system may move the work piece about the laser beam (for example, through a table translatable in the X-Y plane), may move the laser beam about the work piece (for example, through steering mirrors) or may utilize a combination of both techniques.

Figure 9:
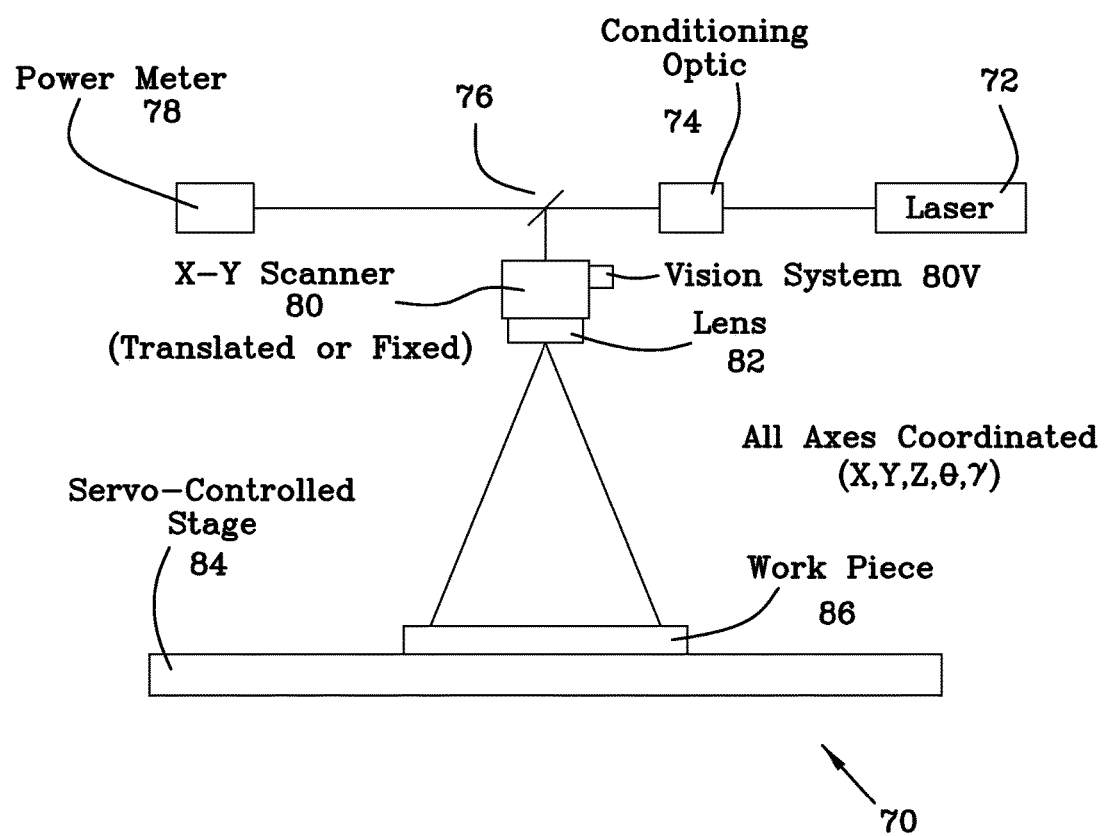
FIG. 9 is a diagrammatic representation of a laser machining system.

FIG. 9 represents an example of a laser machining system 70 capable of forming filaments in a glass substrate. It includes an ultrafast laser 72 capable of supplying a train of burst-mode pulses, preferably with a pulse width less than 100 picoseconds, equipped with a suitable collection of beam steering optics, such that the laser beam can be delivered to a multi-axis rotation and translation stage including: a rotational stage in the XY plane (theta, θ), a 3D XYZ translational stage, and an axis for tipping the beam or the part relative to the X axis (gamma, γ) in a coordinated control architecture. In the example embodiment shown, the beam is manipulated by conditioning optic 74 (e.g. a positive or negative lens or combination of lenses capable of delivering a weakly focused spot that can be further conditioned or manipulated), beam sampling mirror 76, power meter 78, X-Y scanner 80, final focusing lens 82, and servo-controlled stage 84 for positioning workpiece 86 (glass substrate). Knowing the coordinates of a disconnection, the vision system 80V precisely locates the disconnection after which the operator is able to make the repair.

Figure 10:
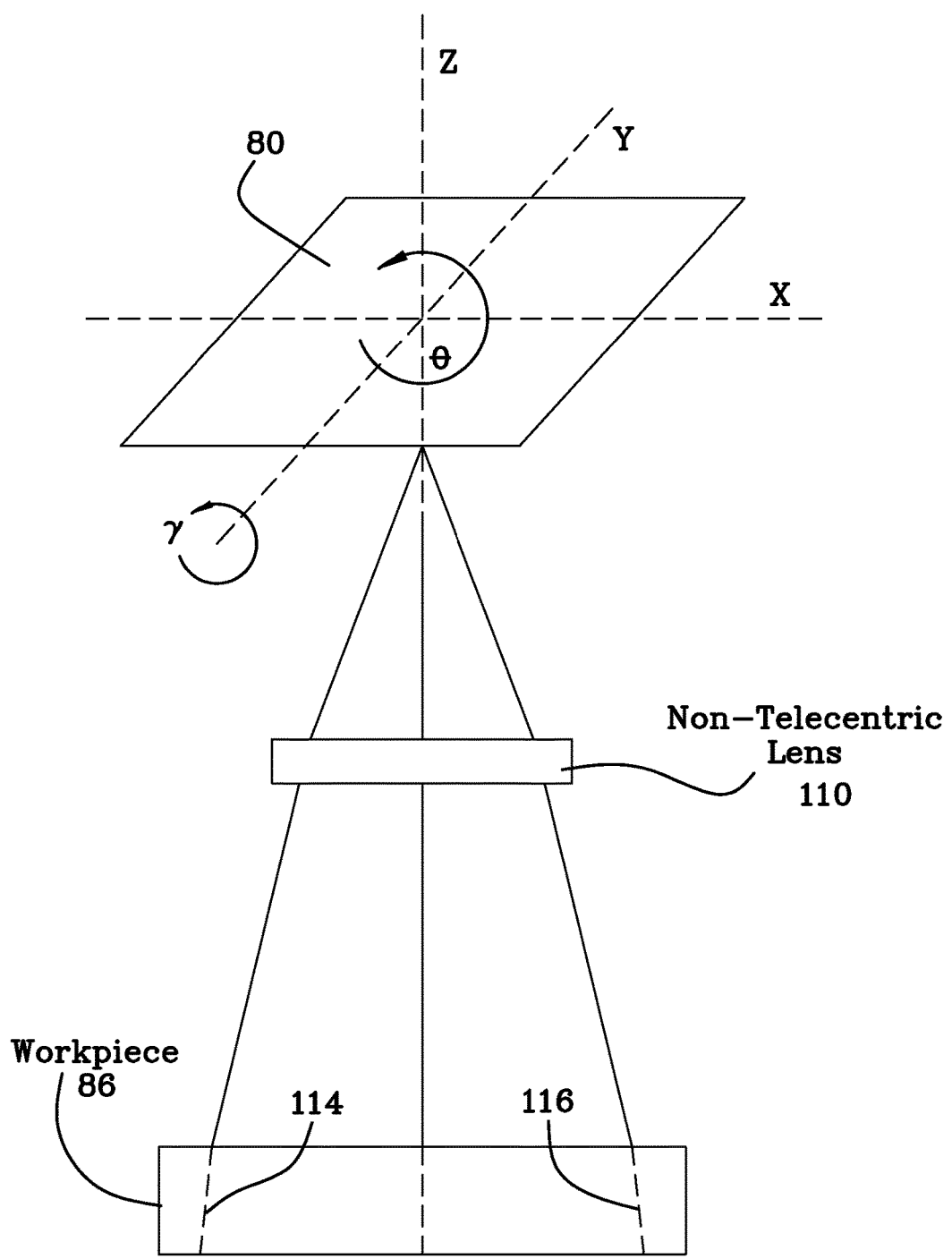
FIGS. 10 and 11 illustrate the X-Y scanner, using non-telecentric and telecentric lenses.
Figure 11:
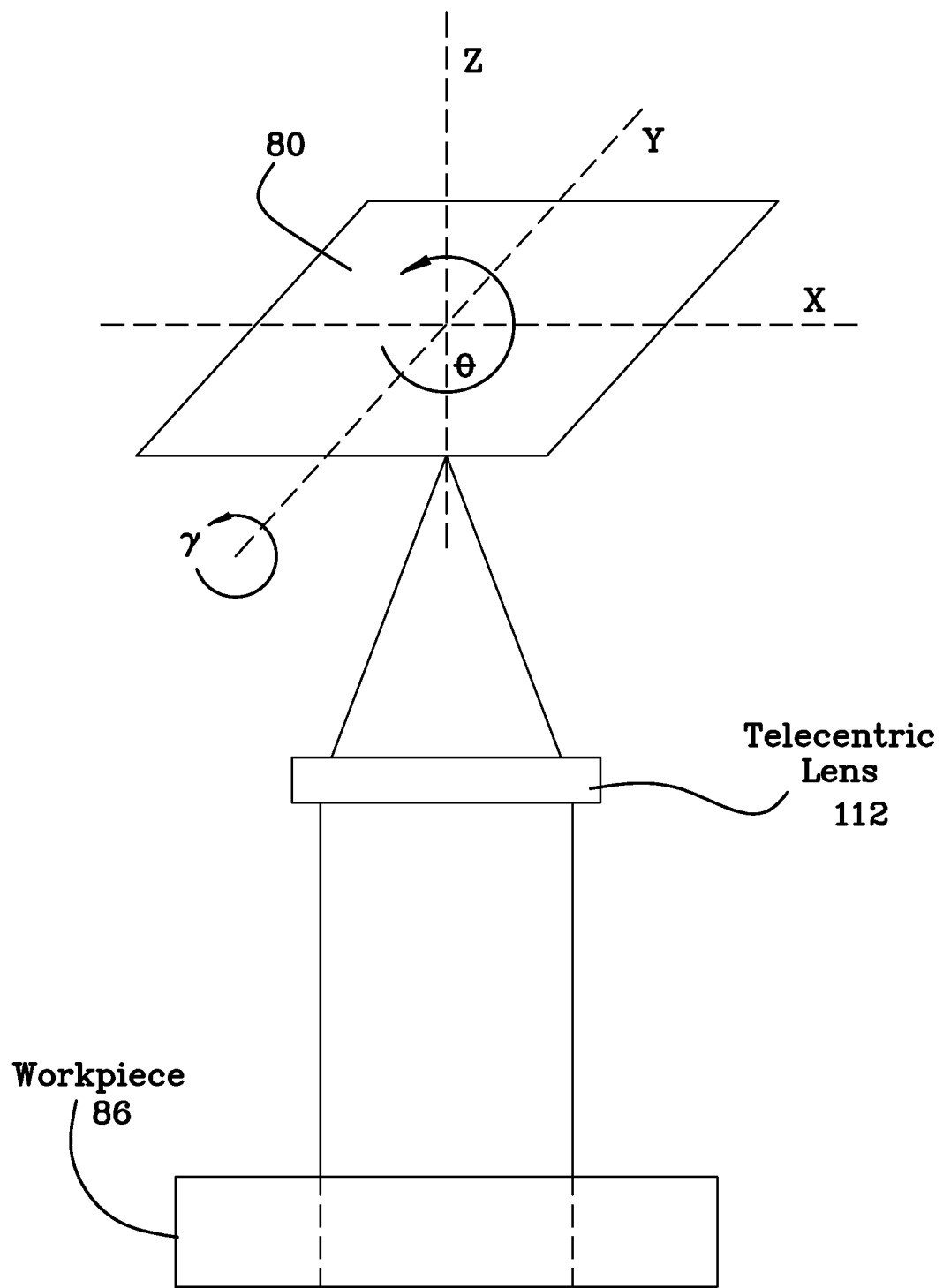

FIGS. 10 and 11 illustrate example embodiments showing the ability to control multiple axes via a control of stage of the X-Y scanner 80, using non-telecentric 110 lens (FIG. 10) and telecentric lens 112 (FIG. 11). Rotation about the X (gamma) axis may be performed. It is to be understood that other optical configurations are possible.

Figure 12A:
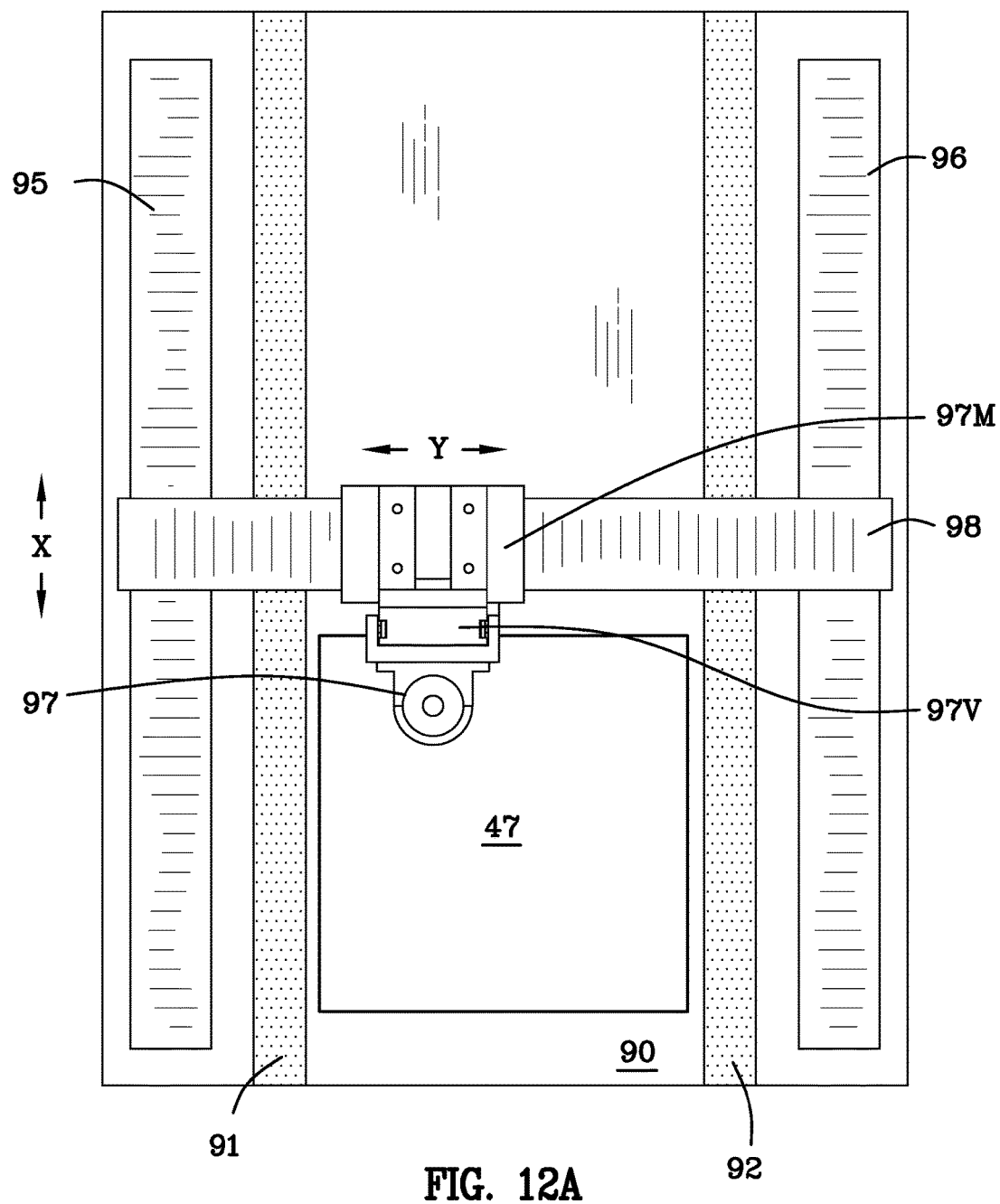
FIG. 12A is a schematic top view of an example laser system used in the forward deposition process, for printing or repairing traces on LCD's; and, FIG. 12B is a schematic side view of an example laser system used in the forward deposition process, for printing or repairing traces on LCD's.
Figure 12B:
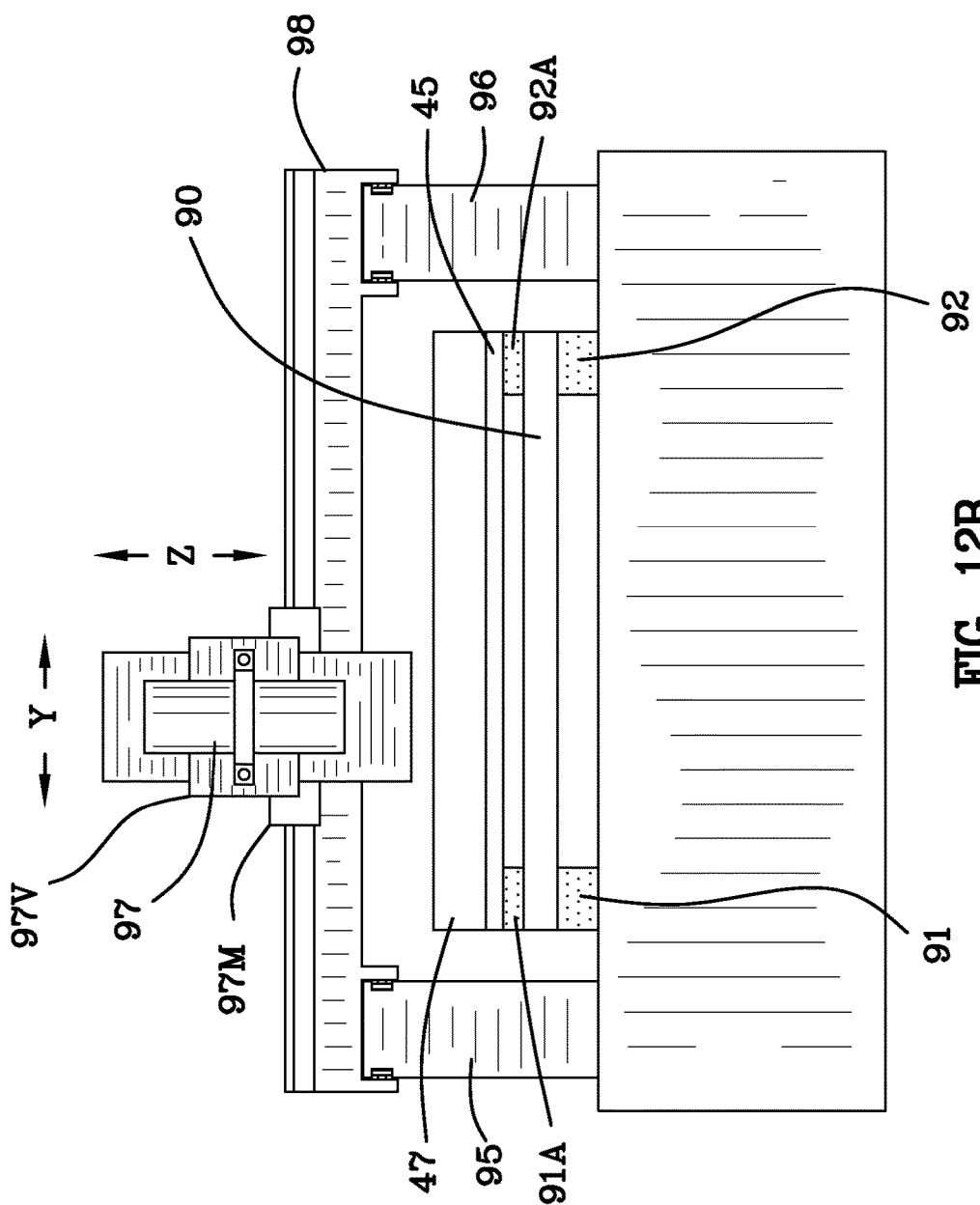

FIG. 12A is a schematic top view of an example laser system for printing or repairing traces on LCD devices. Reference numeral 47 represents the carrier substrate with material to be deposited affixed thereto. X-Y motion of the laser head 97 is illustrated in FIG. 12A wherein the laser head 97 is illustrated schematically above target substrate 90. Target substrate 90 is supported by beams 91, 92 above a granite (or other dimensionally stable) support. Rails 95, 96 support the movable arm 98 which is movable in the X direction along the rails 95, 96 as illustrated in FIG. 12A. Movable arm 98 is driven by a motor and a controller which precisely positions the movable arm 98 in the X direction. Similarly, the laser head 97 is driven by a motor and a controller and is precisely movable and positioned along the movable arm 98 in the Y direction as illustrated in FIG. 12A. FIG. 12B is a schematic side view of the example laser system illustrated in FIG. 12A used in the forward deposition process, for printing or repairing traces on LCD's. FIG. 12B illustrates supports 91A, 91B upon which the carrier substrate 47 resides. The material to be deposited sometimes referred hereto as the ink, is affixed to the carrier substrate 47. FIG. 12B illustrates how the head 97 is moved in the vertical Z direction for control of the filament position. An adjustable lens (not shown) is placed intermediate the laser head 97 and the carrier substrate 47.

Movable arm 98 includes rail means and the laser head 97 includes a motor 97M or other means for positioning the laser head 97 in the Y direction. Further the laser head is movable in the Z direction for adjusting the beam filaments as desired. Vertical rail 97V enables movement of the laser head 97 in the vertical direction (the Z direction). Still further, it is understood that a selected distributive-focus lens may be adapted for use with the laser head 97.

The aforementioned apparatus, with multi-axis rotational and translational control, when utilizing burst ultrafast laser pulses to accomplish forward deposition may be employed for the purpose of bringing the beam on to the work piece(s) at variable focus positions, non-normal angles of incidence and at variable, recipe controlled positions for the purpose of creating complex trace geometries, presently not possible using the prior art techniques currently employed. Those skilled in the art will recognize that all of these axes are not required for all applications and that some applications will benefit from having simpler system constructions. Furthermore, it is to be understood that the apparatus shown is but one example implementation of the embodiments of the present disclosure, and that such embodiments may be varied, modified or hybridized for a wide variety of substrates, applications and part presentation schemes without departing from the scope of the present disclosure by the device manufacturers.

The Forward Deposition Methodology

The steps of forward deposition of a material onto a dielectric substrate are as follows:

providing a laser beam comprising a burst of laser pulses;

providing a laser beam delivery system capable of focusing said laser beam onto said material to be deposited and to enable relative movement between said laser beam and said material to be deposited;

providing a transparent carrier substrate with a material affixed to one side thereof and creating a suitably adjusted filament within;

stacking a transparent carrier substrate with a material affixed to one side thereof, in a spaced configuration adjacent a dielectric substrate no further than 2 mm apart, said transparent carrier located between said dielectric substrate and a laser beam source capable of burst ultrafast laser beam pulses;

passing laser energy pulses from a laser source through a lens focusing assembly;

adjusting the relative distance and or angle of said lens focusing assembly in relation to said laser beam source so as to focus the laser energy pulses into a spot of laser fluence at an interface of said transparent carrier substrate and said material to be deposited;

adjusting the fluence level to a sufficient intensity to ensure clean forward deposition of the material to be deposited onto the substrate; and applying at least one burst of laser pulses of a suitable wavelength, suitable burst pulse repetition rate and suitable burst pulse energy from the laser source to the target through the lens focusing assembly, wherein the total amount of pulse energy or fluence, applied at a spot on said material to be deposited is greater that the critical energy level required to initiate and propagate forward deposition via filament formation, yet is lower than the threshold critical energy level required to initiate ablative machining; and, stopping the burst of laser pulses when the desired series of traces have been deposited onto the substrate.

It is to be understood that the invention is not limited in its application to the arrangements of the components set forth in the following description or illustrated in the drawings. The invention is capable of other embodiments and of being practiced and carried out with various different ordered steps. Also, it is to be understood that the phraseology and terminology employed herein are for the purpose of descriptions and should not be regarded as limiting. As such, those skilled in the art will appreciate that the conception, upon which this disclosure is based, may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

The invention claimed is:

1. A process of forward deposition of a material onto a target substrate, said material being coated onto a bottom surface of a carrier substrate, comprising the steps of:

producing a laser beam having bursts of ultrashort laser pulses, each burst of ultrashort laser pulses having a plurality of sub-pulses, each sub-pulse having a pulse width of less than 100 picoseconds, the carrier substrate being transparent to said laser beam;

focusing said laser beam;

passing said focused laser beam through said carrier substrate, each burst of ultrashort pulses creating a self-focusing filament, thereby focusing said laser beam below the diffraction limit of said laser beam, the pulse energy applied at a spot on said material to be transferred is greater than the energy required to initiate and propagate forward deposition by way of filament formation;

lifting said material to be transferred from said carrier substrate with the first few sub-pulses of a burst of ultrashort pulses;

driving said lifted material across a narrow gap from said carrier substrate onto said target substrate with subsequent sub-pulses of said burst of ultrashort pulses, said subsequent sub-pulses passing through said carrier substrate with a very high divergence angle; and, fusing said driven material onto and into said target substrate.

2. The process of forward deposition onto a target substrate as claimed in claim 1, further comprising the steps of:

flash annealing said fused material by virtue of extremely high and uniform energy density achieved on said surface of said fused deposited material as it travels toward said substrate.

3. The process of forward deposition onto a target substrate as claimed in claim 1, wherein said carrier substrate is glass, said target substrate is dielectric and said material to be transferred is conductive.

4. The process of forward deposition onto a target substrate as claimed in claim 1, wherein said carrier substrate is selected from the group of borosilicate glass, Si wafers, and Sapphire, and said material to be transferred is selected from the group of copper, chromium, SiC, GaN, doped oxide glasses, gold, organic materials, nano particles and polymers.

5. The process of forward deposition of a material onto a target substrate as claimed in claim 1, comprising the steps of:

creating a principal focus 200 μm above said carrier substrate, said laser beam focused to create a filament tip 1 μm below said transparent carrier substrate, then using said filament tip to ablate said material from said carrier substrate toward said target substrate.

6. The process of forward deposition of a material onto a target substrate as claimed in claim 1, wherein said laser beam has a wavelength transparent to said carrier substrate.

7. The process of forward deposition of a material onto a target substrate as claimed in claim 5, wherein said filament tip size is dependent on the wavelength of said laser beam and said wavelength is transparent to said carrier substrate.

8. The process of forward deposition of a material onto a target substrate as claimed in claim 5 wherein laser energy goes into said material at the region of said laser tip in bursts faster than it can be thermally dissipated by said material, resulting in an energy increase in said material from its ground state in stepwise amounts.

9. The process of forward deposition of a material onto a target substrate as claimed in claim 1, further comprising the steps of:

enabling relative movement between said laser beam and said material; and creating a trace of said material on said target substrate.

10. The process of forward deposition of a material onto a target substrate as claimed in claim 1, further comprising the steps of:

maintaining separation of said material affixed to said carrier substrate and said target substrate to less than or equal to 2 mm.

11. The process of forward deposition of a material onto a target substrate as claimed in claim 1, wherein said step of fusing said material onto and into said target substrate includes simultaneously curing said material.

12. A method of forward deposition of a material onto a target substrate, said material being affixed to one side of a carrier substrate, comprising the steps of:

providing a laser source producing a laser beam comprising a burst of ultrashort laser pulses having a pulse width of less than 100 picoseconds, the laser beam having a wavelength transparent to said carrier substrate;

providing a laser beam delivery system to enable relative movement between said focused laser beam and said material to be deposited;

stacking said transparent carrier substrate with the side carrying the material to be deposited in a spaced configuration proximate to said target substrate no further than 2 mm apart, said transparent carrier substrate located between said target substrate and said laser source;

passing said laser beam through a lens focusing assembly and creating a self-focusing filament within said transparent carrier substrate, said filament focusing said laser beam below the diffraction limit of said laser beam;

adjusting the relative distance and or angle of said lens focusing assembly in relation to said laser source so as to focus the laser beam into a spot at an interface of said transparent carrier substrate and said material to be deposited;

adjusting the fluence level of said laser beam at said spot to ensure clean forward deposition of said material to be deposited onto said target substrate;

applying at least one burst of laser pulses at a pulse repetition rate and pulse energy from said laser source to said material to be deposited through said lens focusing assembly, wherein the pulse energy applied at said spot is greater than the critical energy level required to initiate and propagate forward deposition by way of filament formation within said transparent carrier substrate, the first few pulses of each burst lifting said material to be deposited from said transparent carrier substrate and subsequent pulses of each burst driving said material onto said target substrate;

fusing said material onto and into said target substrate and simultaneously curing said material; and, stopping said burst of laser pulses when a desired series of traces have been deposited onto said target substrate.

13. A method of forward deposition of a material onto a target substrate, as claimed in claim 12, wherein said transparent carrier substrate is selected from the group of borosilicate glass, Si wafers, and Sapphire, and said material to be deposited is selected from the group of copper, silver, chromium, aluminum, SiC, GaN, doped oxide glasses, gold, organic materials, nano particles and polymers.

14. A process of forward deposition of a material onto a target substrate, said material being coated onto a bottom surface of a carrier substrate, comprising the steps of:

providing a laser beam comprising a burst of ultrashort laser pulses having a pulse width of less than 100 picoseconds, said carrier substrate being transparent to said laser beam;

focusing said laser beam through a lens to form a self-focusing filament within said carrier substrate, the laser beam being focused by said filament below the diffraction limit of said laser beam;

passing said laser beam through said carrier substrate, the pulse energy applied at a spot on said material to be transferred is greater than the energy required to initiate and propagate forward deposition by way of filament formation;

lifting said material from said carrier substrate with the first pulses of each burst and driving said lifted material across a narrow gap between said carrier substrate and said target substrate with subsequent pulses of each burst, thereby driving said lifted material onto said target substrate; and, simultaneously curing and fusing said driven material onto and into said target substrate.

15. A method of forward deposition of a material onto a target substrate, said material being affixed to one side of a carrier substrate, comprising the steps of:

providing a laser source producing a laser beam comprising bursts of ultrashort laser pulses at a burst repetition rate of between 1 hertz and 2 megahertz, each sub-pulse within a burst having a pulse width of less than 100 picoseconds, each burst having between 2 and 50 sub-pulses, each burst having an energy in a range from 1 to 100 microjoules, said laser beam having an average power from 1 to 200 watts, and said laser beam having a wavelength in a range from 350 nanometers to 2 micrometers that is transparent to said carrier substrate;

providing a laser beam delivery system to enable relative movement between said focused laser beam and said material to be deposited;

stacking said transparent carrier substrate with the side carrying the material in a spaced configuration proximate to said target substrate no further than 2 mm apart, said transparent carrier substrate located between said target substrate and said laser source;

passing said laser beam through a lens focusing assembly and creating a self-focusing filament within said transparent carrier substrate, said filament focusing the laser beam below the diffraction limit of said laser beam;

adjusting the relative distance and or angle of said lens focusing assembly in relation to said laser source so as to focus said laser beam to a spot at an interface of said transparent carrier substrate and said material to be deposited;

adjusting the fluence level of said laser beam at said spot to ensure clean forward deposition of said material to be deposited onto the target substrate;

applying at least one burst of laser pulses from said laser source to said material through said lens focusing assembly, wherein the pulse energy applied at said spot on said material to be deposited is greater than the critical energy level required to initiate and propagate forward deposition by way of filament formation within said transparent carrier substrate, with at least the first sub-pulse of each burst lifting said material to be deposited from said transparent carrier substrate and subsequent sub-pulses of each burst driving said material onto said target substrate;

fusing said material onto and into said target substrate and simultaneously curing said material; and, stopping said burst of laser pulses when the desired series of traces have been deposited onto said target substrate.

* * * * *